(12) United States Patent
Shilmkar et al.

(10) Patent No.: US 11,502,026 B2
(45) Date of Patent: Nov. 15, 2022

(54) TRANSISTOR WITH FLIP-CHIP TOPOLOGY AND POWER AMPLIFIER CONTAINING SAME

(71) Applicant: NXP USA, Inc., Austin, TX (US)

(72) Inventors: Vikas Shilmkar, Chandler, AZ (US); Ramanujam Srinidhi Embar, Gilbert, AZ (US); Ibrahim Khalil, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/068,051

(22) Filed: Oct. 12, 2020

(65) Prior Publication Data
US 2022/0115297 A1  Apr. 14, 2022

(51) Int. Cl.
*H01L 23/485* (2006.01)
*H01L 23/552* (2006.01)
*H01L 23/00* (2006.01)
*H01L 29/06* (2006.01)

(52) U.S. Cl.
CPC .......... *H01L 23/485* (2013.01); *H01L 23/552* (2013.01); *H01L 24/81* (2013.01); *H01L 29/0696* (2013.01)

(58) Field of Classification Search
None
See application file for complete search history.

(56) References Cited

U.S. PATENT DOCUMENTS

| | | | |
|---|---|---|---|
| 7,166,898 B2 | 1/2007 | Briere | |
| 7,290,864 B2 | 11/2007 | King | |
| 9,064,947 B2 | 6/2015 | Roberts et al. | |
| 9,653,410 B1 | 5/2017 | Holmes et al. | |
| 9,727,254 B2 | 8/2017 | Jeon | |
| 9,800,209 B2 | 10/2017 | Li | |
| 9,960,145 B2 | 5/2018 | Costa et al. | |
| 10,075,132 B2 | 9/2018 | Jones et al. | |
| 10,594,276 B2 | 3/2020 | Jones et al. | |

(Continued)

FOREIGN PATENT DOCUMENTS

EP 3428971 A1 1/2019

OTHER PUBLICATIONS

U.S. Appl. No. 16/984,286; NFOA; 9 pages, filed Oct. 20, 2021.
(Continued)

*Primary Examiner* — Long Pham (57) ABSTRACT

A semiconductor device includes a die body having a frontside and a transistor having an active area formed in the die body, the active area being bounded by an outer periphery. An interconnect structure is formed over the frontside of the die body and contains patterned electrically conductive material defining first, second, and third contacts electrically coupled to first, second, and third subregions, respectively, within the active area of the transistor. A frontside input/output (I/O) interface is formed in an outer portion of the interconnect structure. The frontside I/O interface contains first, second, and third contact pads, the first contact pad being electrically connected to the first contact, the second contact pad being electrically connected to the second contact, and the third contact pad being electrically connected the third contact, wherein the third contact pad is positioned at a location overlying the active area of the transistor.

20 Claims, 5 Drawing Sheets

(56) References Cited

U.S. PATENT DOCUMENTS

| | | | |
|---|---|---|---|
| 10,734,303 | B2 | 8/2020 | Odnoblyudov |
| 2002/0185675 | A1 | 12/2002 | Furukawa |
| 2004/0245638 | A1 | 12/2004 | Nemtsev et al. |
| 2010/0109052 | A1 | 5/2010 | Nakajima et al. |
| 2012/0012945 | A1 | 1/2012 | Inoue |
| 2014/0070881 | A1 | 3/2014 | Annes et al. |
| 2017/0077051 | A1 | 3/2017 | Sanders et al. |
| 2018/0006611 | A1 | 1/2018 | de Jong et al. |
| 2018/0226506 | A1 | 8/2018 | Chang et al. |
| 2020/0118922 | A1 | 4/2020 | Hill |
| 2021/0002137 | A1 | 1/2021 | Schultz et al. |
| 2021/0202408 | A1* | 7/2021 | Khalil ................ H03F 3/21 |
| 2021/0265473 | A1 | 8/2021 | Yamaguchi et al. |
| 2021/0313293 | A1 | 10/2021 | Noori et al. |

OTHER PUBLICATIONS

U.S. Appl. No. 17/007,175; not yet published; 45 pages, filed Aug. 31, 2020.

U.S. Appl. No. 16/984,286; not yet published; 21 pages, filed Aug. 4, 2020.

U.S. Appl. No. 17/205,390; not yet published; 68 pages, filed Mar. 18, 2021.

Hill, Darrell et al; "28-V Low Thermal-Impedance HBT With 20-W CW Output Poser"; IEEE Transactions on Microwave Theory and Techniques, vol. 45, No. 12; 5 pages (Dec. 1997).

Hill, Darrell et al; "Three-Dimensional MMIC Architecture Using Low Thermal Impedance Technology"; IEEE MTT-S Digest; 4 pages (1998).

Xu, Jane; "GaN HEMTs based Flip-chip Integrated Broadband Power Amplifier"; University of California at Santa Barbara, ONR MURI Center Impact—Innovative Microwave Power Amplifier Consortium Center; retrieved from the Internet https://my.ece.ucsb.edu/Mishra/ganitrideelec/xudefense.pdf; 72 pages (Dec. 2000).

Kuo, Che-Chjung et al; "A 3.5-GHz SiGe 0.35um HBT Flip-Chip Assembled on Ceramics Integrated Passive Device Doherty Power Amplifier for SiP Integration"; Proceedings of the Asia-Pacific Microwave Conference 2011; 4 pages (2011).

Notice of Allowance; U.S. Appl. No. 16/984,286; 9 pages, filed Mar. 22, 2022.

\* cited by examiner

PRIOR ART

FIG. 3

PRIOR ART

TRANSISTOR WITH FLIP-CHIP TOPOLOGY AND POWER AMPLIFIER CONTAINING SAME

TECHNICAL FIELD OF THE INVENTION

The present invention relates generally to semiconductor devices. More specifically, the present invention relates to power amplifiers having transistors with flip-chip topologies.

BACKGROUND OF THE INVENTION

A power amplifier typically includes a module substrate and at least one radio frequency (RF) power die, which is mounted to the module substrate in an upright or non-inverted orientation. The module substrate may be, for example, a printed circuit board (PCB), a ceramic substrate, or another substrate having electrically-conductive routing features with which the RF power die is electrically interconnected. A given power amplifier may contain a single RF power die or multiple RF power dies in addition to any number of other microelectronic components, such as discretely-placed capacitors and resistors.

By conventional design, an RF power die often includes a metallized backside serving as a backside contact (e.g., ground) of the RF power die, which is electrically coupled to a corresponding terminal of a transistor circuit integrated into the die. For example, in the case of a field effect transistor (FET), the source terminal of the FET may be electrically coupled to ground through such a backside contact. Contacts to the other terminals of the transistor (e.g., the gate and drain terminals in the case of the FET) may be formed as input and output bond pads located on the frontside of the RF power die and, specifically, formed in an outer terminal surface of a multi-layer system formed over the frontside of the die body. When installed within a given system (e.g., a power amplifier), wire bonds may be formed between the frontside input and output bond pads and corresponding electrical routing features of the module substrate to complete electrical interconnection of the RF power die.

SUMMARY

Aspects of the disclosure are defined in the accompanying claims.

In a first aspect, there is provided a semiconductor device comprising a die body having a frontside; a transistor having an active area formed in the die body, the active area being bounded by an outer periphery; an interconnect structure formed over the frontside of the die body, the interconnect structure containing patterned electrically conductive material defining first, second, and third contacts electrically coupled to first, second, and third subregions, respectively, within the active area of the transistor; and a frontside input/output (I/O) interface formed in an outer portion of the interconnect structure, the frontside I/O interface containing first, second, and third contact pads, the first contact pad being electrically connected to the first contact, the second contact pad being electrically connected to the second contact, and the third contact pad being electrically connected the third contact, wherein the third contact pad is positioned at a location overlying the active area of the transistor.

In a second aspect, there is provided s power amplifier comprising a module substrate having a die support surface and a power die. The power die comprises a die body having a frontside; a field effect transistor (FET) having an active area formed in the die body, the active area being bounded by an outer periphery; an interconnect structure formed over the frontside of the die body, the interconnect structure containing patterned electrically conductive material defining gate, drain, and source electrodes electrically coupled to channel, drain, and source subregions, respectively, within the active area of the FET; a frontside input/output (I/O) interface formed in an outer portion of the interconnect structure, the frontside I/O interface containing gate, drain, and source contact pads, the gate contact pad being electrically connected to the gate electrode, the drain contact pad being electrically connected to the drain electrode, and the source contact pad being electrically connected the source electrode, wherein the source pad is positioned at a location overlying the active area of the FET; and electrically conductive connection elements on each of the gate, drain, and source contact pads, the conductive connection elements coupling the power die in an inverted orientation with the gate, drain, and source contact pads facing the die support surface of the module substrate.

In a third aspect, there is provided a method of implementing a power amplifier comprising providing a power die that includes a die body having a frontside, a transistor having an active area formed in the die body, the active area being bounded by an outer periphery, an interconnect structure formed over the frontside of the die body, the interconnect structure containing patterned electrically conductive material defining gate, drain, and source contacts electrically coupled to channel, drain, and source subregions, respectively, within the active area of the transistor, and a frontside input/output (I/O) interface formed in an outer portion of the interconnect structure, the frontside I/O interface containing gate, drain, and source contact pads, the gate contact pad being electrically connected to the gate contact, the drain contact pad being electrically connected to the drain contact, and the source contact pad being electrically connected the source contact, wherein the source contact pad is positioned at a location overlying the active area of the transistor; forming electrically conductive connection elements on each of the gate, drain, and source contact pads; and utilizing the conductive connection elements to couple the power die to a module substrate in an inverted orientation with the gate, drain, and source contact pads facing a die support surface of the module substrate.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail semiconductor devices, and more specifically a transistor device having a flip-chip topology. The layout of the transistor device enables interconnection of transistor input, output, and source terminals through a frontside input/output (I/O) interface. Electrical interconnections between contact pads contained in the die's frontside I/O interface and the corresponding electrical routing features of the module substrate may be formed utilizing electrically conductive connection elements, such as solder balls or electrically-conductive pillars, to avoid the usage of wire bonds. The layout of the transistor device enables the effective utilization of gaps between transistor fingers to create contact pads for source regions, thereby resulting in a compact transistor. Further, the topology enables vertical flow of source currents through patterned electrically conductive material and electrically conductive vertical connections extending from the frontside of the die body through an interconnect structure to provide a low impedance path to ground. Additionally, the arrangement of the typically grounded source contacts between input and output contact pads may provide effective isolation between the input and outputs. Such flip-chip semiconductor devices may be well-suited for incorporation into a power amplifier, e.g., a modular electronic assembly, containing at least one radio frequency (RF) power die utilized for power or signal amplification purposes. When so incorporated, a given flip-chip semiconductor device may be mounted to a module substrate, such as a printed circuit board (PCB) or a ceramic substrate, in an inverted orientation such that the frontside I/O interface of the semiconductor device faces the die support surface of the module substrate.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, upper and lower, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
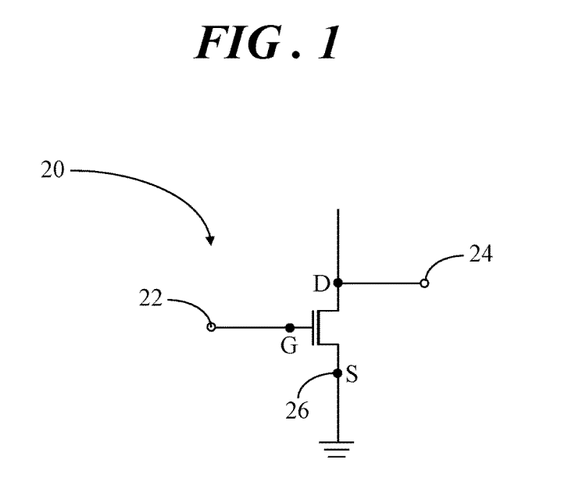
FIG. 1 shows a schematic of a common source FET device configuration.

Referring to FIG. 1, FIG. 1 shows a schematic of a common source field-effect transistor (FET) device configuration 20. In common source FET configuration 20, the gate, G, serves as an input port 22 (e.g., signal input or control), and the drain, D, serves as an output port 24 (e.g., current supply). The source, S, serves as a common connection 26 (e.g., ground or reference voltage) in common source configuration 20 since it is the FET lead which is grounded as shown in FIG. 1. Thus, common source configuration 20 is an example of a two-port active device in which two of the three leads of the FET serve as the input and output ports and the third lead is utilized as the common connection. For clarity of discussion, transistor layouts discussed herein have common source configuration 20. However, the following discussion applies equivalently to other two-port active semiconductor device configurations in which, for example, the gate may serve as the common connection or the drain may serve as the common connection.

Figure 2:
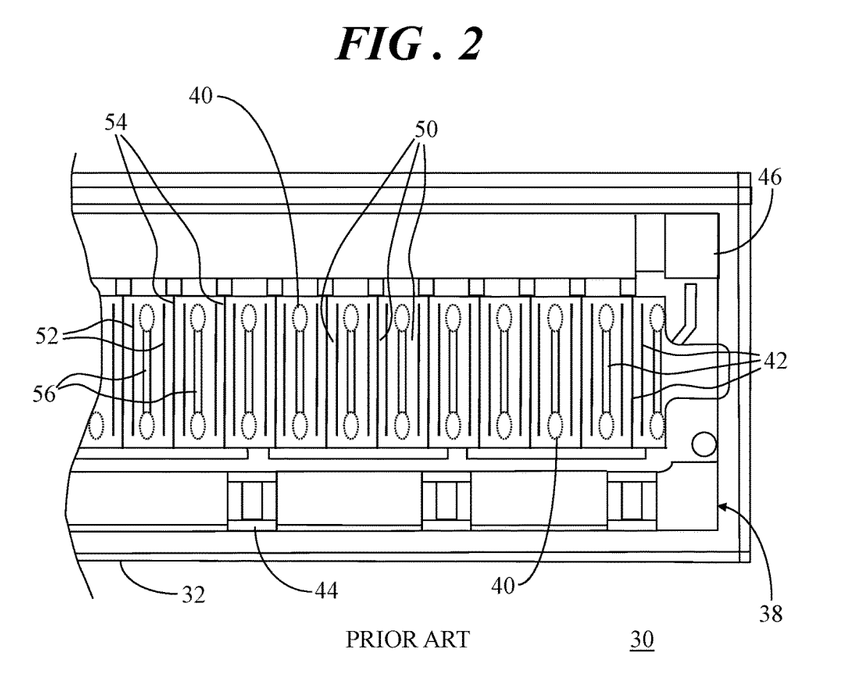
FIG. 2 shows a partial plan view of a layout of a prior art semiconductor device.
Figure 3:
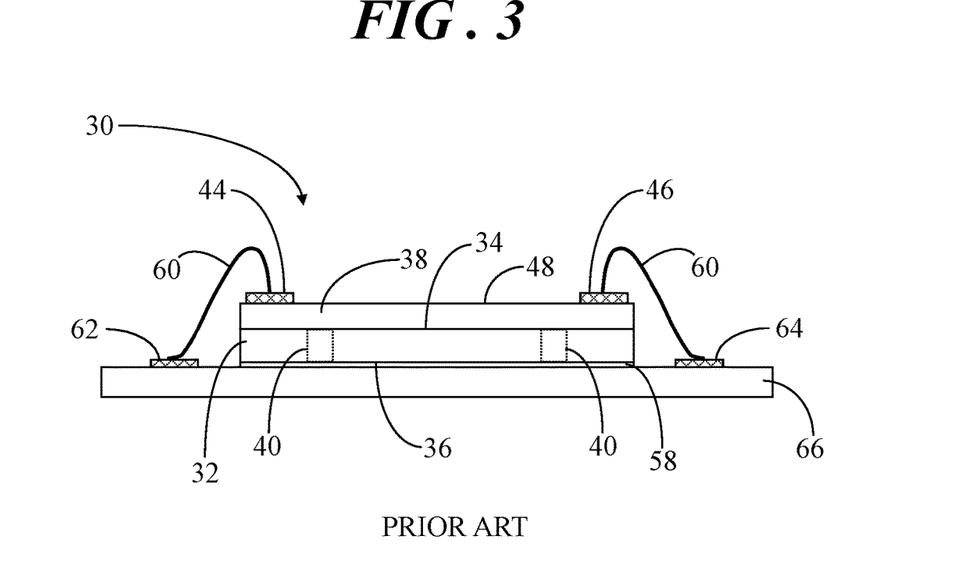
FIG. 3 shows a side view of the prior art semiconductor device of FIG. 2.

Referring to FIGS. 2 and 3, FIG. 2 shows a partial plan view of a layout of a prior art semiconductor device, or die, 30 and FIG. 3 shows a simplified side view of semiconductor device 30. That is, semiconductor device 30 is an example of a conventional die arrangement. Semiconductor device 30 includes a base substrate 32 (also referred to as a die body) having upper and lower surfaces 34, 36, respectively (see FIG. 3). A build-up structure or frontside layer system, referred to herein as an interconnect structure 38, is formed over the upper surface of base substrate 32. Interconnect structure 38 may include patterned electrically conductive material and electrically conductive vertical connections extending from upper surface 34 of base substrate 32 through interconnect structure 38. Electrical connections between upper and lower surfaces 34, 36 of base substrate 32 may be made using conductive through substrate vias (TSVs). In the illustrated configuration, semiconductor device 30 includes a plurality of source vias 40. Source vias 40 are represented as dotted ovals in FIG. 2 and as dotted columns in FIG. 3 because source vias 40 may not extend into or entirely through the overlying interconnect structure 38 of semiconductor device 30 and are therefore not visible.

Semiconductor device 30 includes an active area (e.g., transistor) that includes a plurality of parallel, elongated transistor contacts or fingers 42, each of which extends generally between respective gate and drain bond pads 44, 46 of semiconductor device 30. In this example, gate and drain bond pads 44, 46 are positioned on a topside outer portion 48 (see FIG. 3) of interconnect structure 38. These gate and drain bond pads 44, 46 are suitably electrically connected to contacts 42 through the patterned electrically conductive material (not shown) of interconnect structure 38. Additionally, semiconductor device 30 includes a plurality of channel regions 50, where channel regions 50 particularly include the spaces between neighboring ones of contacts 42. In semiconductor device 30, contacts 42 include a plurality of elongated gate contacts 52, a plurality of elongated drain contacts 54, and a plurality of elongated source contacts 56.

Elongated gate contacts 52 extend from one or more gate bond pads 44 toward (but not to) one or more drain bond pad(s) 46, and elongated drain contacts 54 extend from one or more drain bond pad(s) 46 toward (but not to) one or more gate bond pads 44. Gate contacts 52 may overlie channel regions 50 and gate bond pad 44 electrically interconnects all of the plurality of elongated gate contacts 52. In other arrangements, multiple gate bond pads may be implemented, where each gate bond pad electrically connects a subset of the gate contacts. Elongated drain contacts 54 generally extend along the sides of channel regions 50 and drain bond pad 46 electrically interconnects all of the elongated drain contacts 54. Each of elongated source contacts 56 is electrically coupled to one or more of source vias 40, and source vias 40 are positioned adjacent to gate contacts 52. Each of source vias 40 extend through base substrate 32 to provide a conductive path between one or more of source contacts 56 that are coupled to the respective source via(s) 40 and lower surface 36 of semiconductor device 30 (e.g., and to a conductive layer 58, see FIG. 3, on lower surface 36 of semiconductor device 30 that serves as a ground reference).

As used herein, the "source-to-drain pitch" refers to the distance (in a horizontal direction in FIG. 2) between the centers of neighboring ones of source contacts 50 and drain contacts 48. Additionally, although the terms "contact" and "finger" have been used synonymously above, a transistor "finger" can also be considered to be a grouping of a neighboring pair of a source contact and a drain contact on a die, and the "source-to-drain pitch" can accordingly also refer to the distance (in a horizontal direction) between the centers of a pair of source and drain contacts of a given transistor finger.

With particular reference to FIG. 3, when installed within a given system, bond wires 60 may be formed between the frontside bond pads (e.g., gate and drain bond pads 44, 46) and corresponding electrical routing features 62, 64 of a secondary structure (e.g., a module substrate 66) to complete electrical interconnection of semiconductor device 30 within the system.

High-efficiency power amplifier (PA) design is increasingly becoming an integral part of wireless communication systems. Indeed, the cellular base station market is slowly transitioning to gallium-nitride (GaN) based radio frequency (RF) products that are expected to be suitable for fifth generation (5G) communications. In many implementations that employ Doherty PA circuits or other multi-path PA circuits, the physical die area is of key concern, as power transistor products included in commercial wireless infrastructure systems have become increasingly cost-sensitive as well as area/volume/weight sensitive. With GaN technology, this is particularly important as the technology per square millimeter is significantly more expensive than that of silicon (Si) or other III-V based semiconductors. Because GaN is not manufactured on a native substrate, lattice mismatch prevents growing wafer size beyond approximately six inches in diameter. Accordingly, each GaN wafer tends to yield fewer power transistor die than are typically achievable using Si wafer technology.

Unfortunately, wire-bonding processes can be a time consuming, hence costly, assembly processes. Furthermore, the overall transistor size including bond wires 60 to transfer power to/from semiconductor device 30 is critical to Doherty PA circuit size. That is, a wire-bonded semiconductor die consumes extra space due to the presence of bond wires 60. Further, losses and coupling/radiation due to the wire bond interconnections (e.g., bond wires 60) can result in an RF performance penalty of semiconductor device. Still further, a wire-bonded semiconductor die typically requires the presence of through silicon vias (e.g., source vias 40) through base substrate, in a direction away from interconnect structure 38, to a backside metallized source terminal (e.g., conductive layer 58). The inclusion of TSVs within some semiconductor devices is associated with additional limitations. TSV formation often adds considerable cost and duration to manufacturing processes. Additionally, TSV formation may increase the likelihood of die cracking or other structural compromise of power dies, which can potentially decrease yield and increase average per-die manufacturing costs.

Embodiments discussed herein entail a flip-chip transistor topology that avoids the usage of bond wires and source TSVs, enables a reduction in area consumption due to the absence of the bond wires, yields a more robust mechanical structure, while having little to no RF performance penalty relative to wire bonded semiconductor devices. Additionally, cost savings may be realized by eliminating the process steps associated with TSV formation, while manufacturing yield may be improved due to a reduced likelihood of die cracking during IC fabrication.

Figure 4:
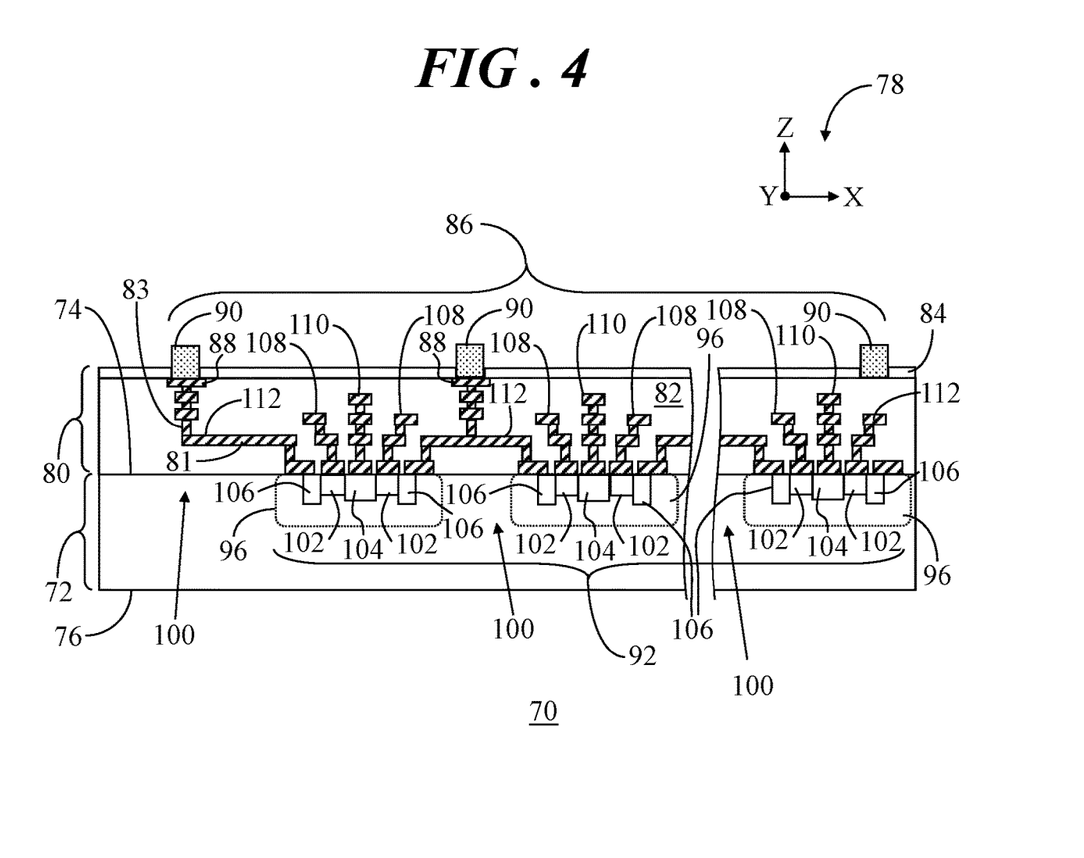
FIG. 4 shows a simplified cross-sectional side view of a semiconductor device having a flip chip topology in accordance with an embodiment.

FIG. 4 shows a simplified cross-sectional side view of a semiconductor device 70 having a flip chip topology in accordance with an embodiment. Semiconductor device 70 may be, for example, a radio frequency (RF) power die that may, in some embodiments, be implemented in a power amplifier (discussed in connection with FIG. 8). Semiconductor device 70 includes a die body 72 having a frontside 74 and an opposing backside 76. Frontside 74 and backside 76 of die body 72 are spaced along a vertical axis of semiconductor device 70, which extends substantially orthogonal to frontside 74 and corresponds to the Z-axis of a coordinate legend 78 appearing in the upper right of FIG. 4. An interconnect structure 80, alternatively referred to as a "build-up structure" or "frontside layer system," contains a number of layers of patterned electrically conductive material 81 (e.g., metal layers) and electrically conductive vertical connections 83 (e.g., metal plugs) and is integrally formed with die body 72 by build-up over frontside 74. Patterned conductive material 81 and vertical connections 83 are represented by upward and rightward directed hatching for clarity of illustration. Interconnect structure 80 can include any practical number of layers of patterned conductive material 81 greater than one and may commonly contain between three and five layers of patterned conductive material formed at different levels or elevations along a vertical axis (again, defined herein as an axis extending orthogonal to frontside 74 and parallel to the Z-axis of coordinate legend 78).

Terms of relative positioning, such as "above" and "beneath," are utilized below to describe the various features formed within interconnect structure 80. Such terms are defined in relation to relative proximity to frontside 74 of die body 72 such that, for example, a first feature or element may be described as located at a level "above" a second feature or element when the second feature is located closer to die body frontside 74 than is the first feature. Similarly, the terms "over" and "overlie" are utilized throughout this document to describe the relative positioning between two features or elements sharing a vertically overlapping relationship, as taken along a vertical axis. Thus, as an example, interconnect structure 80 is described as formed over or overlying frontside 74 of die body 72 regardless of the particular orientation of semiconductor device 70 in free space.

As previously indicated, the number of patterned conductive material layers included in interconnect structure 80 will vary between embodiments. In the illustrated embodiment, and by way of non-limiting example, interconnect structure 80 is schematically depicted as containing five patterned conductive material layers. By common nomenclature, these patterned conductive material layers may be referred to as the "M1" through "M5" patterned conductive material layers, with the descriptor "M1" referring to the initially-formed layer of patterned conductive material 81, the descriptor "M2" referring to the next layer of patterned conductive material 81 formed after the M1 patterned conductive material 81, the descriptor "M3" referring to the layer of patterned conductive material 81 formed after the M2 patterned conductive material 81, and so on. Further, in keeping with the foregoing description, the M1 patterned conductive material 81 may be referred to as the "innermost" or "inner" layer of patterned conductive material 81 herein, while the M5 patterned conductive material 81 may be referred to as the "outermost" or "outer" layer of patterned conductive material 81. The layers of patterned conductive material 81 and vertical connections 83 are surrounded by layers of dielectric material, which collectively form a dielectric body of interconnection structure 80 generally identified by reference numeral "82" in FIG. 4. Dielectric body 82 may also include at least one outer terminal dielectric layer 84, which serves as a solder mask or as a passivation layer.

A frontside I/O interface 86 is further provided along the outer terminal surface of interconnect structure 80 (commonly referred to as the "frontside" of semiconductor device 70) and includes a number of contact pads 88, which provide electrical connection to the different terminals of a transistor IC integrated into semiconductor device 70, as further discussed below. Semiconductor device 70 may additionally include electrically conductive connection elements 90 (e.g., pillars, solder balls, or other such contact extensions) formed on contact pads 88 configured for flip-chip bonding to a secondary structure, as will be discussed in greater detail below.

Figure 5:
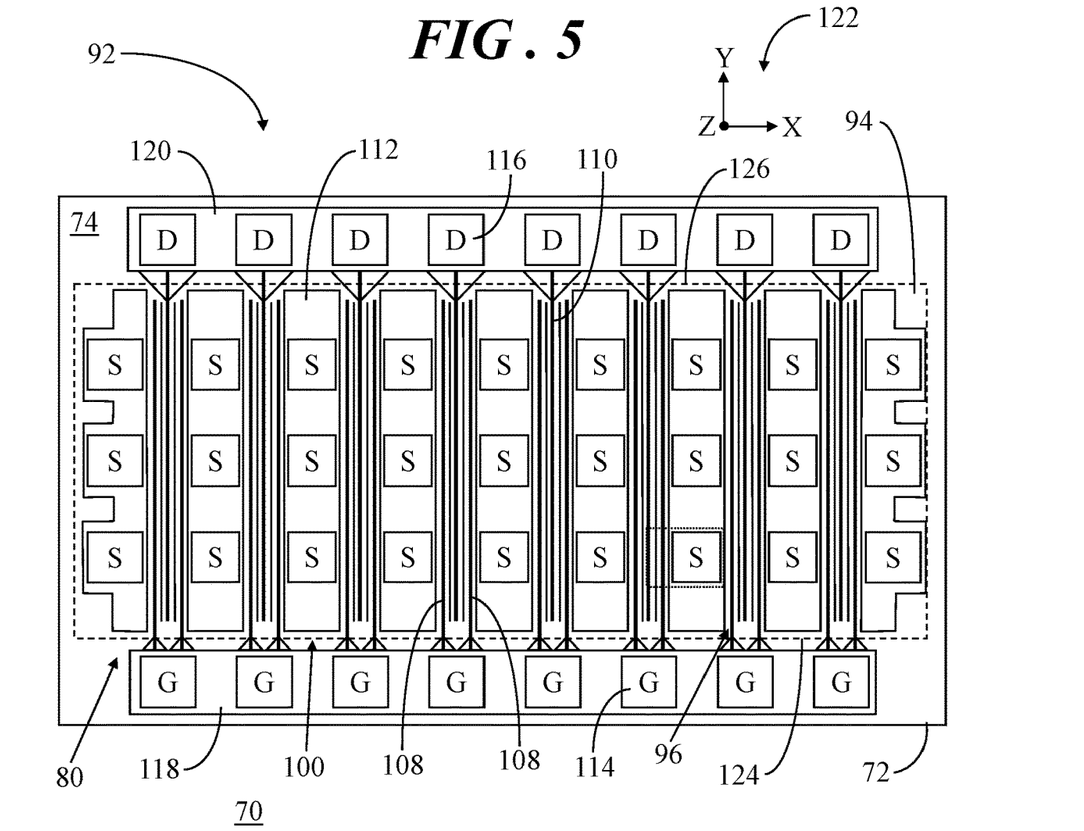
FIG. 5 shows a simplified plan view of the semiconductor device of FIG. 4.

Referring momentarily to FIG. 5 in connection with FIG. 4, FIG. 5 shows a simplified plan view of transistor integrated circuit (IC), referred to herein as a transistor 92, that may be implemented in semiconductor device 70. Transistor 92 has an active area 94 formed in die body 72 in which active area 94 is bounded by an outer periphery. In FIG. 5, the outer periphery of active area 94 is generally delineated by a dashed line box. Further discussion of FIG. 5 will be provided below following the description of FIG. 4

With reference back to FIG. 4, active area 94 (FIG. 5) of transistor 92 includes a plurality of active regions 96 in die body 72 constituting individual channels of transistor 92, with active regions 96 being spaced apart by inactive regions 100, also in die body 72. In the illustrated example of FIG. 4, active regions 96 are delineated by dotted line boxes and inactive regions 100 constitute the space between adjacent active regions 96.

In this example, the innermost (M1) layer of conductive materials 81 of interconnect structure 80 is patterned to define various electrically conductive (e.g., metal) features, which provide contact to active first, second, and third subregions 102, 104, 106 included in each active region 96 of transistor 92 formed in semiconductor device 70. When transistor 92 is a FET, the active transistor subregions will generally include doped source subregions 106 and doped drain subregions 104 formed in die body 72 at locations adjacent frontside 74 of die body 72; or, perhaps, buried beneath frontside 74 by some amount depending upon the nature of the implants used and the desired transistor topology. The term "active region 96," as appearing herein, also encompasses first subregions 102 of semiconductor material located between adjacent source and drain subregions 106, 104 and in which the transistor channel forms when transistor 92 begins conducting. As such, first subregions 102 may be referred to herein as channel subregions 102, second subregions 104 may be referred to herein as drain subregions 104, and third subregions 106 may be referred to herein as source subregions 106. Accordingly, active regions 96 of transistor 92 include channel, drain, and source subregions 102, 104, 106 within active area 94 (FIG. 5) of transistor 92 and inactive regions 100 are free of (e.g., "to lack" or "be devoid of") channel, drain, and source subregions 102, 104, 106.

In alternative implementations, the active transistor regions may include the emitter and collector regions when one or more bipolar transistors are integrated into semiconductor device. Generally, it may be stated that a transistor integrated circuit 92 or "transistor 92" is formed in semiconductor device 70. The term "transistor IC" is utilized to indicate that more than one transistor 92 may be integrated into semiconductor device 70 and/or additional circuit elements (e.g., impedance matching, harmonic termination, or biasing circuitry) may be formed in semiconductor device 70 in some configurations.

In the following description, transistor ICs containing a single FET (e.g., transistor 92) are discussed for purposes of explanation. In further embodiments, however, other types of transistors (e.g., bipolar transistors) may be integrated into semiconductor device 70 and/or more complex transistor ICs may be provided, such as multi-stage transistor ICs containing multiple transistors formed on a single semiconductor device, such as an RF power die. Further, embodiments may be implemented with various different die technologies, transistor types, and transistor topologies. For example, when the transistor or transistors carried by semiconductor device 70 assume the form of a FET, the FET can be implemented utilizing any of the following die technologies: a silicon-based FET (e.g., a laterally-diffused metal oxide semiconductor FET or LDMOS FET) or a III-V FET (e.g., a GaN FET, a GaAs FET, a gallium phosphide (GaP) FET, an indium phosphide (InP) FET, or an indium antimonide (InSb) FET, or another type of III-V transistor.

Electrically-conductive routing or wiring features are formed in interconnect structure 80 to provide electrical interconnections from externally-exposed contact pads 88 to corresponding patterned features included in the M1 patterned metal layer and channel, drain, and source subregions 102, 104, 106 of transistor 92. These patterned features formed from conductive material 81 and vertical connections 83 are shown in a highly simplified form in the schematic of FIG. 4 and can vary in geometric complexity as required to best suit the layout of the transistor (or transistors) included in semiconductor device 70. When interconnect structure 80 contains three or more layers of patterned conductive material 81, relatively complex wiring schemes or architectures can be employed. Such architectures are generally known and will therefore not be discussed in depth in the description. However, at this juncture in the description, it may be generally noted that each type of contact pad included in contact pads 88 (e.g., gate, drain, and source contact pads) may be electrically coupled to a corresponding active channel, drain, and source subregion 102, 104, 106 of transistor 92 through an electrode structure extending through interconnect structure 80.

Specifically, and again referring to the example of a FET, a first type of contact pad included in contact pads 88 may be electrically coupled to corresponding metal features included in or below the M1 patterned metal layer (e.g., the "gate terminals" overlying channel subregions 102 of transistor 92) through a first contact, referred to herein as a gate electrode structure 108 extending through interconnect structure 80. A second type of contact pad included in contact pads 88 (e.g., one or more drain contact pads) may be electrically coupled to metal features included in the M1 patterned metal layer (e.g., the "drain terminals" providing ohmic contact to doped drain subregions 104 of transistor 92) through a second contact, referred to herein as a drain electrode structure 110 extending through interconnect structure 80. Finally, a third type of contact pad included in contact pads 88 (e.g., one or more source contact pads) may be electrically coupled to corresponding metal features included in the M1 patterned metal layer (e.g., the "source terminals" or the "source metal" providing contact to doped source subregions 106 of transistor) through a third contact, referred to herein as a source electrode structure 112 extending through interconnect structure 80.

In the above-described manner, frontside I/O interface 86 is formed in an outer region of interconnect structure 80 to enable electrical connection to transistor 92 when semiconductor device 70 is integrated into a larger device or module, such as a power amplifier. In certain cases, additional non-illustrated contact pads may be included in frontside I/O interface 86 to support other electrical connections associated with operation of transistor 92, such as contact pads providing electrical connections for gate or drain biasing of one or more FETs. Several benefits are achieved by virtue of such a transistor topology and integrated wiring scheme, which jointly provide exclusive connection to all transistor terminals through frontside I/O interface 86. Unique frontside wiring structures or topologies, combined with unique complementary transistor layouts, enable the provision of such a frontside I/O interface 86 including at least one signal input or control contact (e.g., one or more gate contact pads in the case of a FET), at least one current supply contact (e.g., either drain or source contact pad(s) in the case of FET, depending on whether the FET is an N-channel or P-channel device), and at least one current return contact (e.g., again, either drain or source contact pad(s) in the case of FET, depending on whether the FET is an N-channel or P-channel device).

Die body 72 of semiconductor device 70 may be wholly composed of a single semiconductor material when semiconductor device 70 is produced utilizing a singulated piece of a bulk semiconductor wafer, such as a bulk Si wafer. For example, in this case, die body 72 may be composed of a high resistivity Si material having an electrical resistivity exceeding about 520Ω per cm and, perhaps, approaching or exceed 1 mega-Ω per cm. In other instances, semiconductor device 70 may be fabricated utilizing a layered die technology of a type enabling relatively high transistor power densities. An example of such a power dense die technology is a layered GaN structure in which one or more layers of a GaN material (that is, a semiconductor material containing GaN as its primary constituent, by weight) are formed over one or more substrate layers of another material, such as silicon carbide (SiC). Other examples of layered die technologies suitable for producing die body 72 of semiconductor device 70 include GaAs structures, which likewise support the formation of transistor ICs (e.g., transistor 92) having relatively high power densities. As is the case when die body 72 is composed of a high resistivity Si (or other bulk semiconductor) material, such layered die technologies also typically possess relatively high electrical resistances exceeding 520Ω per cm taken through the thickness of the layered die structure; that is, in the case of die body 72, along the centerline or a vertical axis parallel to the Z-axis of coordinate legend 78.

In conventional RF power die designs fabricated utilizing high electrical resistance die structures and providing an electrical grounding (current return) path through the backmetal structure (e.g., the backmetal structure electrically connected to the source terminal in the case of a FET), TSVs are typically utilized to provide electrical connection between the corresponding doped (e.g., source) regions of the transistor and the backmetal structure. As previously discussed, TSV formation tends to add complexity and cost to the die fabrication process; and, in some instances, may decrease manufacturing yield due to an increased likelihood of crack formation or other structural compromise in the case of certain (e.g., thinner) die structures, depending upon process parameters (e.g., thermal exposures) and other factors. By leveraging unique transistor layouts and integrated wiring strategies within interconnect structure 80, the flip-chip topology of semiconductor device 70 can be fabricated to have a TSV-free construction (or, perhaps, to contain a reduced number of TSVs) to improve manufacturing efficiency, lower manufacturing cost, and boost yield, while providing other performance benefits discussed below.

Referring collectively to FIGS. 4-5, as mentioned previously, FIG. 5 shows a simplified plan view of transistor 92 that may be implemented in semiconductor device 70. Transistor 92 includes die body 72 and the overlying interconnect structure 80. In this illustration, dielectric body 82 of interconnect structure 80 is not shown so as to better visualize the various features within interconnect structure 80.

Active area 94 of transistor 92 includes active regions 96 and inactive regions 100, as discussed above. Gate and drain contact pads 114, 116 (represented by "G" and "D" in FIG. 5) of the generally referenced contact pads 88 (shown in FIG. 4) are contained in frontside I/O interface 86 formed in the outer portion of interconnect structure 80 of semiconductor device 70. A plurality of parallel, elongated transistor contacts (also referred to as runners or fingers) extend between respective gate and drain contact pads 114, 116. In semiconductor device 70, the elongated transistor contacts include first, second, and third contacts 108, 110, 112, which are alternatively referred to herein as gate, drain, and source electrode structures 108, 110, 112 when transistor 92 is a FET. As such, gate and drain contact pads 114, 116 are suitably electrically connected to respective gate and drain electrode structures 108, 110 within interconnect structure 80.

Elongated gate electrode structures 108 (e.g., runners or fingers) extend from one or more gate contact pads 114 through interconnect structure 80 toward (but not to) one or more drain contact pads 116, and elongated drain electrode structures 110 (e.g., runners or fingers) extend from one or more drain contact pads 116 toward (but not to) one or more gate contact pads 114. Gate electrode structures 108 may overlie the channel regions (e.g., in active regions 96) of transistor 92 and gate electrode structures 108 may be electrically interconnected by a gate manifold structure 118 underlying gate contact pads 114. Further, gate electrode structures 108 are electrically connected to channel subregions 102 (see especially FIG. 4) within active regions 96 of transistor 92. Drain electrode structures 110 may generally extend along the sides of the channel regions of transistor 92 and drain electrode structures 110 may be electrically interconnected by a drain manifold structure 120 underlying drain contact pads 116. Further, drain electrode structures 110 are electrically connected to drain subregions 104 (see especially FIG. 4) within active regions 96 of transistor 92.

In some embodiments, gate and drain contact pads 114, 116 are positioned at locations outside the outer periphery of active area 94 of transistor 92. More specifically, gate and drain electrode structures 108, 110 extend substantially parallel to one another along a first axis of semiconductor device 70, which extends substantially parallel to frontside 74 and corresponds to the Y-axis of a coordinate legend 122 appearing in the upper right of FIG. 5. Gate contact pads 114 are located adjacent to a first side 124 of active area 94 and drain contact pads 116 are located adjacent to a second side 126 of active area 92, where first and second sides 124, 126 are opposite one another and first and second sides 124, 126 are oriented along a second axis of semiconductor device 70, which extends substantially parallel to frontside 74 and is perpendicular to the first axis, which corresponds to the X-axis of coordinate legend 122.

Elongated source electrode structures 112 within interconnect structure 80 overlie inactive regions 100 within transistor area 94 of transistor 92. Source contact pads 128 (illustrated by "S" in FIG. 5), of the generally referenced contact pads 88, are electrically connected to source electrode structures 112, and as discussed previously, source electrode structures 112 are electrically coupled to source subregions 106. Like gate and drain contact pads 114, 116, source contact pads 128 are also contained in frontside I/O interface 86 formed in the outer portion of interconnect structure 80 of semiconductor device 70. However, source contact pads 128 are positioned at locations overlying active area 94 of transistor 92, and more specifically, overlying inactive regions 100 of active area 94 of transistor 92. Thus, source contact pads 128 are positioned between gate electrode structures 110 of adjacent active regions 96, and are further positioned between gate and drain contact pads 114, 116. The location of source contact pads 128 and the presence of conductive connection elements 90 (e.g., pillars, solder bumps, and so forth) over source connect pads 128 can provide a low impedance path to ground. Further, the arrangement of source contact pads 128 relative to gate and drain contact pads 114, 116 can provide effective isolation between gate and drain contact pads 114, 116. In accordance with an embodiment, transistor 92 of semiconductor device 70 lacks conventional through silicon vias (TSVs) extending through die body 72. Instead, suitably configured routing features of source electrode structures 112 within interconnect structure 80 electrically interconnect source subregions 106 to source contact pads 128 at frontside I/O interface 86.

Figure 6:
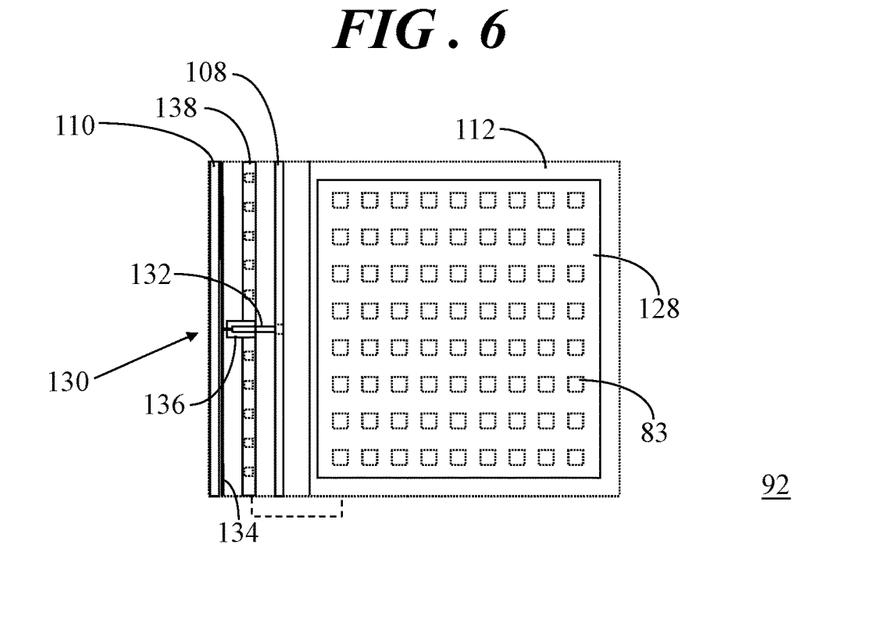
FIG. 6 shows plan view of an enlarged portion of the semiconductor device delineated in FIG. 5 by a dashed line box.

FIG. 6 shows plan view of an enlarged portion of transistor 92 delineated in FIG. 5 by a dotted line box. In this enlarged view, a portion of drain electrode structure 110 (e.g., finger or runner), a portion of gate electrode structure 108 (e.g., finger or runner), and a portion of source electrode 112 are visible at a tap location 130 of transistor 92. Transistor 92 may include a plurality of tap interconnects 132 (one shown) formed from electrically conductive material, typically metal. Tap interconnects 132 are electrically connected between gate electrode structures 108 and gate taps 134 to channel subregions 102 (FIG. 4) formed within die body 72. Thus, tap interconnects 132 form a portion of an input to channel subregions 102, and tap locations 130 are the positions where tap interconnects 132 approach drain electrode structure 110 (typically a pillar forming a portion of an output from drain subregion 104, see FIG. 4).

The potential for undesirable feedback capacitance imposed upon the output metallization (e.g. drain electrode structure 110) is greatest at the input metallization (e.g., tap interconnects 132). That is, the input signal tapped from gate electrode structure 108 can add parasitic feedback capacitance to an output signal from drain electrode structure 110. Accordingly, transistor 92 may include shield structures 136 (one shown) formed in interconnect structure 80 and interposed between tap interconnects 132 of gate electrode structures 108 and drain electrode structures 110 at tap locations 130. Such shield structures 136 are configured to largely block an electric field between tap interconnects 132 and the pillar of drain electrode structure 110. Shield traces 138 (one shown) of shield structures 136 may be strategically longitudinally aligned with gate electrode structure 108. Shield traces 138 in interconnect structure 80 may be suitably configured with patterned conductive material 81 (FIG. 3) and vertical connections 83 (FIG. 3) to electrically interconnect shield structures 136 with source electrode structures 112 so as to provide a path to ground. This electrical interconnection between shield trace 138 and source electrode structure 112 is represented by a dashed line for simplicity of illustration.

The enlarged view of FIG. 6 additionally shows one of source contact pads 128 and vertical connections 83 coupling source contact pad 128 to the underlying source electrode structure 112. Although a multiplicity of vertical connections 83 are shown underlying source contact pad 128, vertical connections 83 may be arranged differently in alternative embodiments. For example, a row of vertical connections 83 may be formed in interconnect structure 80 adjacent to and electrically interconnected with source contact pad 128.

Figure 7:
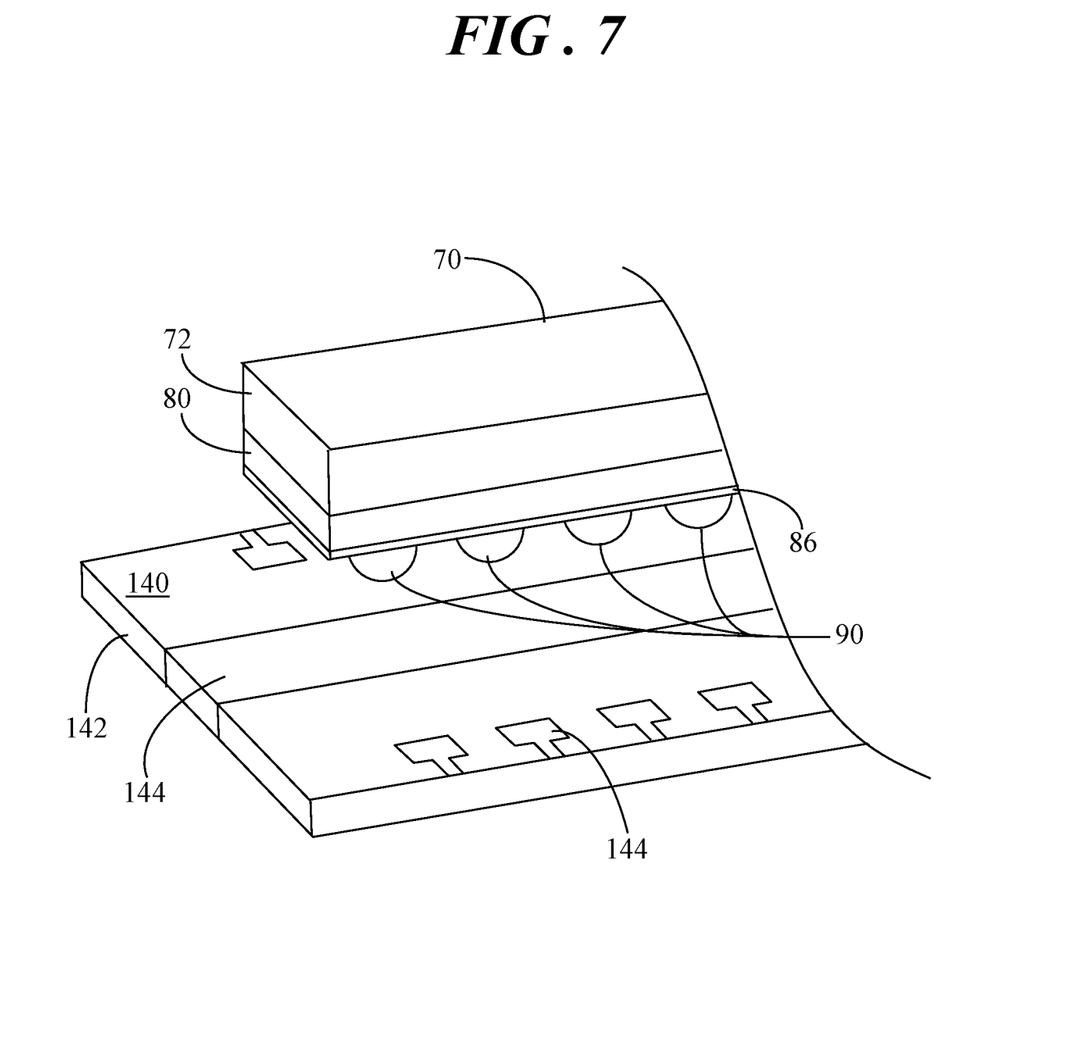
FIG. 7 shows a partial isometric view of the semiconductor device of FIGS. 4-6 of a larger electronic assembly (partially shown) in which the semiconductor device may be incorporated.

FIG. 7 shows a partial isometric view of the semiconductor device 70 of FIGS. 4-6 of a larger electronic assembly (partially shown) in which semiconductor device 70 may be incorporated. Due to its the flip-chip topology, semiconductor device 70 may be well-suited for installation within a power amplifier in an inverted orientation, such that frontside I/O interface 86 faces toward a die support surface 140 of a secondary structure 142 (e.g., a power amplifier substrate) to which at least one semiconductor device 70 is mounted, potentially along with any number of additional microelectronic components.

Semiconductor device 70 can be mounted to secondary structure 142 in an inverted orientation such that frontside I/O interface 86 may be physically and electrically interconnected with corresponding contact pads or electrical routing features at die support surface 140 of the secondary structure 142 without the usage of bond wires. Specifically, contact pads 88 (FIG. 4, which include gate, drain, and source contact pads 114, 116, 128 shown in FIG. 5) included in frontside I/O interface 86 may be electrically and mechanically interconnected with corresponding routing features 144 of secondary structure 142 utilizing conductive connection elements 90 (e.g., solder balls, electrically-conductive pillars, and so forth). Such an interconnection interface may provide an increased structural durability; and, in certain cases, may reduce parasitic losses otherwise occurring during high frequency operation of a resulting power die (or dies) contained in a power amplifier due to the presence of lengthy wire bonds.

Figure 8:
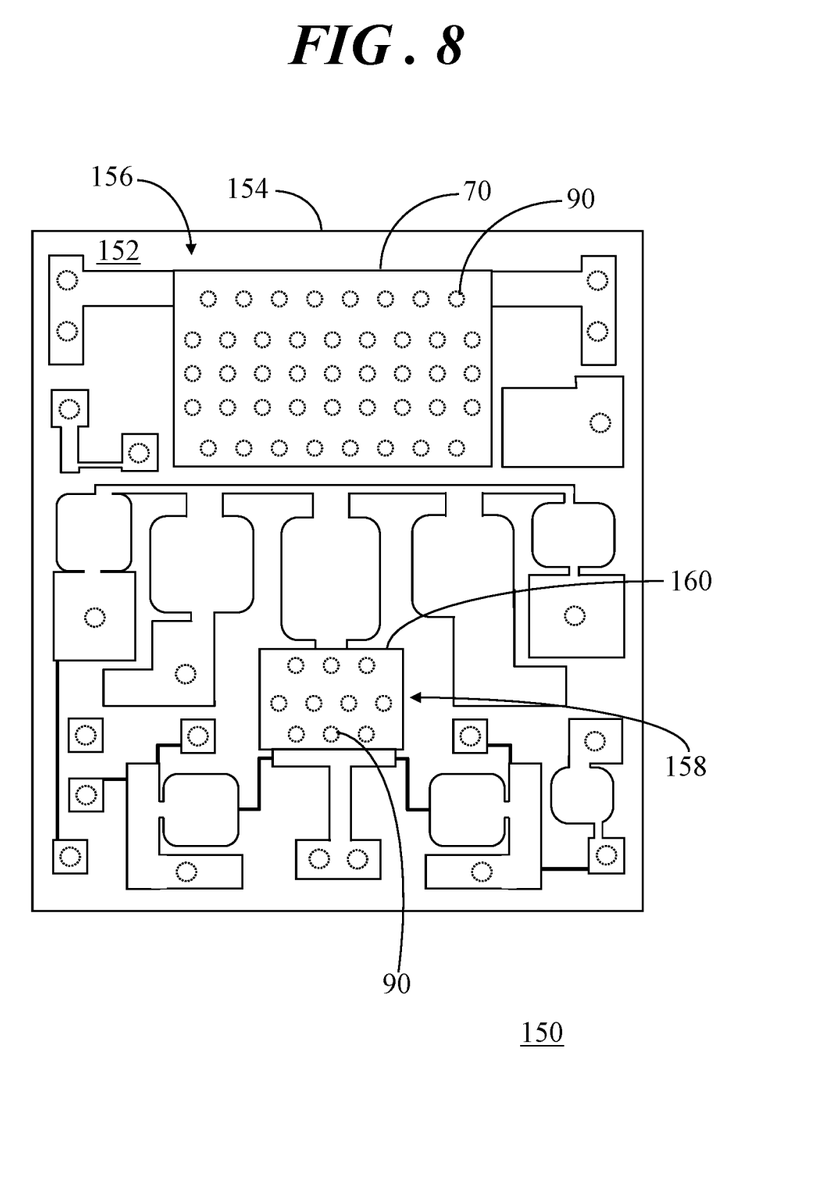
FIG. 8 shows a plan view of a power amplifier integrated circuit containing at least one semiconductor device having the flip-chip topology in accordance with another embodiment.

FIG. 8 shows a plan view of a power amplifier integrated circuit (IC) 150 containing at least one semiconductor device having the flip-chip topology in accordance with another embodiment. The term "power amplifier," as appearing herein, refers to a modular electronic assembly containing at least one RF power die utilized for power or signal amplification purposes. As such, and as mentioned earlier, semiconductor device 70 may be an RF power die and will thus be referred to in connection with FIG. 8 as RF power die 70. Power amplifier 150 may include at least one RF power die 70. In some configurations, power amplifier 150 may contain both peaking and carrier amplifier dies utilized in a Doherty power amplifier IC, which are attached to a die support surface 152 of a module substrate 154, such as a printed circuit board (PCB) or ceramic substrate. In addition, either or both of the peaking and carrier amplifier dies may embody a single stage amplifier or a multiple-stage amplifier.

In the illustrated example, power amplifier IC 150 is a dual stage power amplifier having a primary or pre-amplifier transistor stage 156 that includes power die 70, a secondary or final amplifier transistor stage 158 that includes another power die 160, and various other electronic components (only a few of which are labeled for clarity), such as shunt capacitors and bias circuitry. Power die 70 of pre-amplifier transistor stage 156 and power die 160 of secondary amplifier transistor stage 158 may have the flip-chip topology described in detail above in connection with semiconductor device 70 (FIGS. 4-7). Electrically conductive connection elements 90 (e.g., solder balls, or pillars, and shown in dotted line form) may be deposited over the contact pads of power dies 70, 160 (e.g., gate, drain, and source contact pads 114, 116, 128, FIG. 5) as discussed previously so that power dies 70, 160 can be inverted and mounted (physically joined and electrically interconnected) to die support surface 152 of module substrate 154 such that the frontside I/O interface of power dies 70, 160 face die support surface 152 of module substrate 154. Similarly, the various other electronic components may be mounted to die support surface 152 to form power amplifier 150, which ultimately may be installed in a larger electronic system or assembly.

Accordingly, methodology for implementing a power amplifier includes providing one or more power dies that includes a die body having a frontside, a transistor having an active area formed in the die body, the active area being bounded by an outer periphery, an interconnect structure formed over the frontside of the die body, the interconnect structure containing patterned electrically conductive material defining gate, drain, and source contacts electrically coupled to channel, drain, and source subregions, respectively, within the active area of the transistor, and a frontside input/output (I/O) interface formed in an outer portion of the interconnect structure, the frontside I/O interface containing gate, drain, and source contact pads, the gate contact pad being electrically connected to the gate contact, the drain contact pad being electrically connected to the drain contact, and the source contact pad being electrically connected the source contact, wherein the source contact pad is positioned at a location overlying the active area of the transistor. The methodology further includes forming electrically conductive connection elements on each of the gate, drain, and source contact pads and utilizing the conductive connection elements to couple the power die to a module substrate in an inverted orientation with the gate, drain, and source contact pads facing a die support surface of the module substrate. In some embodiments, the utilizing operation further includes connecting the electrically conductive connection elements on each of the source contact pads to a ground element of the module substrate and providing a path to ground between shield structures of the power die and the ground element of the module substrate.

Thus, the use of bond wires is avoided which may minimize parasitic losses during operation of power amplifier 150 to improve operational efficiency, particularly when the RF power dies 70, 160 are operated at higher frequencies approaching or exceeding 3 Gigahertz. Further, following inverting and mounting, a thermal extension (not shown), such as a copper flange, may be attached the exposed backside 76 (FIG. 4) of power dies 70, 160 for facilitating heat removal for those power dies that are particularly susceptible to excess heat generation and accumulation. While described below as integrated into a particular type of power amplifier IC, it is emphasized that embodiments of power die 70 having the described flip-chip topology can be integrated into various different types of modules (including microelectronic packages), including push-pull-type amplifier modules.

Accordingly, embodiments disclosed herein entail semiconductor devices, and more specifically a transistor device having a flip-chip topology. The layout of the transistor device enables interconnection of transistor input, output, and source terminals through a frontside input/output (I/O) interface. Electrical interconnections between contact pads contained in the die's frontside I/O interface and the corresponding electrical routing features of the module substrate may be formed utilizing electrically conductive connection elements, such as solder balls or electrically-conductive pillars, to avoid the usage of bond wires. The layout of the transistor device enables the effective utilization of gaps between transistor fingers to create contact pads for source regions, thereby resulting in a compact transistor. Further, the topology enables vertical flow of source currents through patterned electrically conductive material and electrically conductive vertical connections extending from the frontside of the die body through an interconnect structure to provide a low impedance path to ground. Still further, the semiconductor devices are produced to lack TSVs to lower manufacturing costs and complexity, and provide increased structural robustness. Additionally, the arrangement of the typically grounded source contacts between input and output contact pads may provide effective isolation between the input and outputs. Such flip-chip semiconductor devices may be well-suited for incorporation into a power amplifier, e.g., a modular electronic assembly, containing at least one radio frequency (RF) power die utilized for power or signal amplification purposes. When so incorporated, a given flip-chip semiconductor device may be mounted to a module substrate, such as a printed circuit board (PCB) or a ceramic substrate, in an inverted orientation such that the frontside I/O interface of the semiconductor device faces the die support surface of the module substrate.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A semiconductor device comprising:
   a die body having a frontside;
   a transistor having an active area formed in the die body, the active area being bounded by an outer periphery;

an interconnect structure formed over the frontside of the die body, the interconnect structure containing patterned electrically conductive material defining first, second, and third contacts electrically coupled to first, second, and third subregions, respectively, within the active area of the transistor; and a frontside input/output (I/O) interface formed in an outer portion of the interconnect structure, the frontside I/O interface containing first, second, and third contact pads, the first contact pad being electrically connected to the first contact, the second contact pad being electrically connected to the second contact, and the third contact pad being electrically connected the third contact, wherein the third contact pad is positioned at a location overlying the active area of the transistor.

2. The semiconductor device of claim 1 wherein:
the transistor comprises a field effect transistor (FET);
the first, second, and third subregions comprise channel, drain, and source subregions, respectively, within the active area of the FET;
the first, second, and third contacts comprise gate, drain, and source electrode structures, respectively, and;
the first, second, and third contact pads comprise gate, drain, and source contact pads, respectively.

3. The semiconductor device of claim 1 wherein the active area of the transistor comprises a plurality of active regions constituting individual channels of the transistor, each of the active regions being spaced apart by inactive regions, the active regions including the first, second, and third subregions, the inactive regions being free of the first, second, and third subregions, and a plurality of the third contact pads are located overlying the inactive regions.

4. The semiconductor device of claim 1 further comprising electrically conductive connection elements on each of the first, second, and third contact pads configured for flip-chip bonding to a secondary structure.

5. The semiconductor device of claim 1 wherein the die body is free of through substrate vias.

6. The semiconductor device of claim 1 wherein the third contact includes layers of the patterned electrically conductive material and electrically conductive vertical connections extending from the frontside of the die body through the interconnect structure that electrically connect the third contact pad to the third subregion.

7. The semiconductor device of claim 1 wherein:
the first contact includes a tap interconnect formed from the patterned electrically conductive material of the interconnect structure, the tap interconnect being in electrical contact with the first subregion and the first contact pad;
the second contact includes a pillar formed from the patterned electrically conductive material of the interconnect structure, the pillar being in electrical contact with the second subregion and the second contact pad; and
the interconnect structure comprises a shield structure formed from the patterned electrically conductive material, the shield structure being electrically connected to the third contact, and the shield structure being electrically isolated from the tap interconnect and the pillar, wherein the shield structure is positioned between the pillar and the tap interconnect, the tap interconnect forms a portion of an input to the first subregion, the pillar forms a portion of an output from the second subregion, and the shield structure is configured to block an electric field between the tap interconnect and the pillar.

8. The semiconductor device of claim 1 wherein the first and second contact pads are positioned at locations outside the outer periphery of the active area of the transistor.

9. The semiconductor device of claim 8 wherein:
the first and second contacts extend substantially parallel to one another along a first axis and overlie the active area of the transistor;
the first contact pad is located adjacent a first side of the active area; and
the second contact pad is located adjacent a second side of the active area, the second side being opposite the first side, the first and second sides being oriented along a second axis perpendicular to the first axis.

10. The semiconductor device of claim 9 wherein the third contact pad is interposed between the first and second contact pads.

11. A power amplifier comprising:
a module substrate having a die support surface; and
a power die comprising:
a die body having a frontside;
a field effect transistor (FET) having an active area formed in the die body, the active area being bounded by an outer periphery;
an interconnect structure formed over the frontside of the die body, the interconnect structure containing patterned electrically conductive material defining gate, drain, and source electrodes electrically coupled to channel, drain, and source subregions, respectively, within the active area of the FET;
a frontside input/output (I/O) interface formed in an outer portion of the interconnect structure, the frontside I/O interface containing gate, drain, and source contact pads, the gate contact pad being electrically connected to the gate electrode, the drain contact pad being electrically connected to the drain electrode, and the source contact pad being electrically connected the source electrode, wherein the source pad is positioned at a location overlying the active area of the FET; and
electrically conductive connection elements on each of the gate, drain, and source contact pads, the conductive connection elements coupling the power die in an inverted orientation with the gate, drain, and source contact pads facing the die support surface of the module substrate.

12. The power amplifier of claim 11 wherein the active area of the FET comprises a plurality of active regions constituting individual channels of the FET, each of the active regions being spaced apart by inactive regions, the active regions including the channel, drain, and source subregions, the inactive regions being free of the channel, drain, and source subregions, and a plurality of the source contact pads are located overlying the inactive regions.

13. The power amplifier of claim 11 wherein the die body is free of through substrate vias.

14. The power amplifier of claim 11 wherein:
the gate electrode includes a tap interconnect formed from the patterned electrically conductive material of the interconnect structure, the tap interconnect being in electrical contact with the channel subregion and the gate contact pad;
the drain electrode includes a pillar formed from the patterned electrically conductive material of the interconnect structure, the pillar being in electrical contact with the drain subregion and the drain contact pad; and
the interconnect structure comprises a shield structure formed from the patterned electrically conductive material, the shield structure being electrically connected to the source electrode, and the shield structure being electrically isolated from the tap interconnect and the pillar, wherein the shield structure is positioned between the pillar and the tap interconnect, the tap interconnect forms a portion of an input to the channel subregion, the pillar forms a portion of an output from the drain subregion, and the shield structure is configured to block an electric field between the tap interconnect and the pillar.

15. The power amplifier of claim 11 wherein the gate and drain contact pads are positioned at locations outside the outer periphery of the active area of the FET.

16. The power amplifier of claim 15 wherein:
the gate and drain electrodes extend substantially parallel to one another along a first axis and overlie the active area of the FET;
the gate contact pad is located adjacent a first side of the active area; and
the drain contact pad is located adjacent a second side of the active area, the second side being opposite the first side, the first and second sides being oriented along a second axis perpendicular to the first axis.

17. The power amplifier of claim 16 wherein the source contact pad is interposed between the gate and drain contact pads.

18. A method of implementing a power amplifier comprising:
providing a power die that includes a die body having a frontside, a transistor having an active area formed in the die body, the active area being bounded by an outer periphery, an interconnect structure formed over the frontside of the die body, the interconnect structure containing patterned electrically conductive material defining gate, drain, and source contacts electrically coupled to channel, drain, and source subregions, respectively, within the active area of the transistor, and a frontside input/output (I/O) interface formed in an outer portion of the interconnect structure, the frontside I/O interface containing gate, drain, and source contact pads, the gate contact pad being electrically connected to the gate contact, the drain contact pad being electrically connected to the drain contact, and the source contact pad being electrically connected to the source contact, wherein the source contact pad is positioned at a location overlying the active area of the transistor;
forming electrically conductive connection elements on each of the gate, drain, and source contact pads; and
utilizing the conductive connection elements to couple the power die to a module substrate in an inverted orientation with the gate, drain, and source contact pads facing a die support surface of the module substrate.

19. The method of claim 18 wherein:
the active area of the transistor comprises a plurality of active regions constituting individual channels of the transistor, each of the active regions being spaced apart by inactive regions, the active regions including the channel, drain, and source subregions, the inactive regions being free of the channel, drain, and source subregions, and a plurality of the source contact pads are located overlying the inactive regions; and
the utilizing operation further includes connecting the electrically conductive connection elements on each of the source contact pads to a ground element of the module substrate.

20. The method of claim 19 wherein:
the gate electrode includes a tap interconnect formed from the patterned electrically conductive material of the interconnect structure, the tap interconnect being in electrical contact with the channel subregion and the gate contact pad;
the drain electrode includes a pillar formed from the patterned electrically conductive material of the interconnect structure, the pillar being in electrical contact with the drain subregion and the drain contact pad;
the interconnect structure comprises a shield structure formed from the patterned electrically conductive material, the shield structure being electrically connected to the source electrode, and the shield structure being electrically isolated from the tap interconnect and the pillar, wherein the shield structure is positioned between the pillar and the tap interconnect, the tap interconnect forms a portion of an input to the channel subregion, the pillar forms a portion of an output from the drain subregion, the shield structure is configured to block an electric field between the tap interconnect and the pillar; and
the connecting operation provides a path to ground between the shield structure and the ground element of the module substrate.

* * * * *